(12) United States Patent
Hosaka et al.

(10) Patent No.: US 11,101,114 B2
(45) Date of Patent: Aug. 24, 2021

(54) PLASMA PROCESSING APPARATUS

(71) Applicant: TOKYO ELECTRON LIMITED, Tokyo (JP)

(72) Inventors: Yuki Hosaka, Miyagi (JP); Yoshihiro Umezawa, Miyagi (JP); Toshiki Nakajima, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 278 days.

(21) Appl. No.: 15/312,225

(22) PCT Filed: Jun. 5, 2015

(86) PCT No.: PCT/JP2015/066318
§ 371 (c)(1),
(2) Date: Nov. 18, 2016

(87) PCT Pub. No.: WO2015/194397
PCT Pub. Date: Dec. 23, 2015

(65) Prior Publication Data
US 2017/0092513 A1 Mar. 30, 2017

(30) Foreign Application Priority Data

Jun. 19, 2014 (JP) .............................. JP2014-126366
Feb. 19, 2015 (JP) .............................. JP2015-030444

(51) Int. Cl.
*H01J 37/32* (2006.01)
*H01L 21/67* (2006.01)
(Continued)

(52) U.S. Cl.
CPC .... *H01J 37/32633* (2013.01); *C23C 16/4412* (2013.01); *C23C 16/45587* (2013.01);
(Continued)

(58) Field of Classification Search
CPC .......... H01L 21/67069; H01L 21/6719; H01L 21/31116; H01L 21/02274; H01L 21/3065;
(Continued)

(56) References Cited

U.S. PATENT DOCUMENTS

2003/0153177 A1* 8/2003 Tepman ............... C23C 16/4412
438/656
2004/0149214 A1* 8/2004 Hirose .............. H01L 21/67069
118/715
(Continued)

FOREIGN PATENT DOCUMENTS

CN          100454498 C     1/2009
JP            2001-196313 A    7/2001
(Continued)

OTHER PUBLICATIONS

English Machine Translation of CN101005031 Shinsuke retrieved from ESPACENET Feb. 13, 2019 (Year: 2009).*
(Continued)

*Primary Examiner* — Rakesh K Dhingra
*Assistant Examiner* — Laureen Chan
(74) *Attorney, Agent, or Firm* — Rothwell, Figg, Ernst & Manbeck, P.C.

(57) ABSTRACT

A plasma processing apparatus includes a baffle structure between a mounting table and a processing chamber. The baffle structure has a first member and a second member. The first member has a first cylindrical part extending between the mounting table and the processing chamber, and a plurality of through-holes elongated in the vertical direction is formed in an array in the circumferential direction in the first cylindrical part. The second member has a second cylindrical part having an inner diameter greater than the outer diameter of the cylindrical part for the first member.

(Continued)

The second member moves up and down in a region that includes the space between the first member and the processing chamber.

6 Claims, 14 Drawing Sheets

(51) Int. Cl.
  *C23C 16/44* (2006.01)
  *C23C 16/455* (2006.01)
  *H01L 21/02* (2006.01)
  *H01L 21/311* (2006.01)
(52) U.S. Cl.
  CPC .. *C23C 16/45589* (2013.01); *C23C 16/45591* (2013.01); *H01J 37/32449* (2013.01); *H01J 37/32715* (2013.01); *H01J 37/32834* (2013.01); *H01L 21/02274* (2013.01); *H01L 21/31116* (2013.01); *H01L 21/6719* (2013.01); *H01L 21/67069* (2013.01); *H01J 2237/334* (2013.01)
(58) Field of Classification Search
  CPC ........... H01J 37/32834; H01J 37/32633; H01J 37/32449; H01J 37/32715; H01J 2237/334; H01J 37/3244; H01J 37/32091; H01J 37/32009; C23C 16/50; C23C 16/4412; C23C 16/455; C23C 16/45589; C23C 16/45587; C23C 16/45591
  See application file for complete search history.

(56) References Cited

U.S. PATENT DOCUMENTS

| | | | | |
|---|---|---|---|---|
| 2004/0261712 | A1* | 12/2004 | Hayashi | H01J 37/3244 118/723 E |
| 2007/0113783 | A1* | 5/2007 | Lee | C23C 16/4412 118/715 |
| 2010/0154709 | A1* | 6/2010 | Fischer | H01J 37/32449 118/723 I |
| 2011/0290419 | A1* | 12/2011 | Horiguchi | H01J 37/3244 156/345.29 |
| 2015/0187545 | A1* | 7/2015 | Lee | H01J 37/32834 216/67 |

FOREIGN PATENT DOCUMENTS

| | | |
|---|---|---|
| JP | 4286576 B2 | 7/2009 |
| KR | 100854808 B1 | 8/2008 |
| KR | 1020130137959 A | 12/2013 |

OTHER PUBLICATIONS

International Search Report dated Jul. 7, 2015 in PCT/JP2015/066318.

* cited by examiner

PLASMA PROCESSING APPARATUS

CROSS REFERENCE TO RELATED APPLICATION

This application is a 35 U.S.C. 371 National Phase Entry Application from PCT/JP2015/066318, filed Jun. 5, 2015, which claims priority to Japanese Patent Application Nos. 2014-126366, filed Jun. 19, 2014 and 2015-030444, filed Feb. 19, 2015, the disclosures of which are incorporated herein in their entirety by reference.

FIELD OF THE INVENTION

The disclosure relates to a plasma processing apparatus.

BACKGROUND OF THE INVENTION

In manufacturing electronic devices such as semiconductor devices or FPDs (Flat Panel Displays), a target object is processed by a plasma. A plasma processing apparatus used for plasma processing generally includes a processing chamber, a mounting table, a gas supply unit, and a gas exhaust unit. The mounting table is installed in the processing chamber. The gas supply unit and the gas exhaust unit are connected to a space in the processing chamber.

Recently, two or more plasma processes need to be performed continuously under different pressure conditions in a single plasma processing apparatus. In the plasma process requiring change of the pressure, a pressure changing period, i.e., a transition time, needs to be shortened. Therefore, it is required to reduce a volume of a space where a processing target object is provided.

A plasma processing apparatus disclosed in Japanese Patent Application Publication No. 2001-196313 is suggested as a plasma processing apparatus that meets the above-described demand. The plasma processing apparatus disclosed in Japanese Patent Application Publication No. 2001-196313 includes two baffle plates provided between a mounting table and a processing chamber. A first space above the two baffle plates includes a region where the target object is provided. The first space is connected to a gas supply unit. A second space below the two baffle plates is connected to a gas exhaust unit.

The two baffle plates are annular plates extending in a horizontal direction. A plurality of openings is formed in each of the two baffle plates and arranged in a circumferential direction. In the plasma processing apparatus disclosed in Japanese Patent Application Publication No. 2001-196313, an overlapping degree of the openings of the two plates in a vertical direction is controlled by rotating one of the two baffle plates in the circumferential direction. Accordingly, in the plasma processing apparatus disclosed in Japanese Patent Application Publication No. 2001-196313, a conductance between the first space and the second space is controlled and a pressure in the first space is controlled.

However, in the plasma processing apparatus disclosed in Japanese Patent Application Publication No. 2001-196313, it is not possible to set the pressure in the first space to a high level without extremely reducing a gap between the two baffle plates. In other words, unless the gap between the two baffle plates is extremely reduced, the conductance between the first space and the second space cannot be reduced. However, if the gap between the two baffle plates is reduced, the baffle plates are made to be in contact with each other and this may lead to generation of particles.

Further, in order to allow the contact between the two baffle plates or in order to accurately arrange the two baffle plates such that the gap therebetween becomes small, the two baffle plates need to have large thicknesses. However, in the case of using the two baffle plates having large thicknesses, even if the two baffle plates are arranged such that the openings formed therein are completely overlapped with each other, it is not possible to reduce the pressure in the first space due to a small conductance between the first space and the second space. In order to reduce the pressure in the first space, the size of the openings formed in the two baffle plates needs to be increased. However, if the size of the openings is increased, a plasma enters the second space. Further, in the case of using the two baffle plates having large thicknesses, a driving unit for the baffle plates is scaled-up in order to deal with the increase in the weight of the baffle plates. Therefore, it is not practical to increase the thicknesses of the baffle plates and the size of the openings formed in the baffle plates.

SUMMARY OF THE INVENTION

In view of the above, the disclosure provides a plasma processing apparatus capable of increasing a control range of a pressure in a space where a processing target object is provided.

In accordance with an aspect of the present disclosure, there is provided a plasma processing apparatus for performing plasma processing on a target object. The plasma processing apparatus includes a processing chamber, a mounting table, a baffle structure, a gas supply unit, and a driving unit. The mounting table is provided in the processing chamber and the mounting table has a mounting region on which a target object is mounted. The baffle structure provided below the mounting region and between the mounting table and the processing chamber. The baffle structure defines a first space including the mounting region and a second space below the mounting region in the processing chamber. The baffle structure includes a first member and a second member. The first member has a first cylindrical part extending between the mounting table and the processing chamber and having a plurality of through-holes elongated in a vertical direction and arranged in a circumferential direction. The second member has a second cylindrical part having an inner diameter greater than an outer diameter of the first cylindrical part. The gas supply unit is connected to the first space. A gas exhaust unit is connected to the second space. The driving unit is configured to vertically move the second cylindrical part in a region including a gap between the first member and the processing chamber.

In this plasma processing apparatus, it is possible to control a ratio in which the through-holes are shielded with respect to the second space by the second cylindrical part by controlling a vertical positional relationship between the first cylindrical part of the first member and the second cylindrical part of the second member. Accordingly, the conductance between the first space and the second space can be controlled. In a state where the second cylindrical part faces the entire through-holes, the conductance between the first space and the second space is mainly determined by the conductance of the gap between the two cylindrical parts. Therefore, a small conductance between the first space and the second space can be obtained regardless of the length in a diametrical direction of the gap between the first cylindrical part of the first member and the second cylindrical part of the second member, i.e., without requiring a high accuracy for the gap. In a state where the second cylindrical part does not face the through-holes, a large conductance between the first space and the second space can be obtained. Accordingly, in the plasma processing apparatus, it is possible to increase a control range of a pressure in the first space where the wafer is disposed.

Although the pressure is applied to the first member and the second member in the diametrical direction, the first member and the second member are hardly bent by the pressure due to the cylindrical shape thereof. Therefore, even if the second member is moved, the first cylindrical part and the second cylindrical part are hardly brought into contact with each other and, thus, generation of particles can be suppressed. Further, the second member can be moved at a high speed due to its thin thickness. Since the through-holes are arranged in the circumferential direction, non-uniformity of a gas exhaust amount in the circumferential direction can be reduced.

The plasma processing apparatus may further include a control unit configured to control the driving unit. The control unit may perform first control in which the driving unit is controlled to set a vertical position of the second member to a first position, and second control in which the driving unit is controlled to set the vertical position of the second member to a second position different from the first position. In the plasma processing, a pressure in the first space in a second control can set differently from a pressure in the first space in the first control. Therefore, after processing a target object by the plasma processing apparatus in one of a low pressure and a high pressure, the target object can be processed in the other of the low pressure and the high pressure in the same plasma apparatus. Thereby, it is possible to process the target object in the same plasma processing apparatus while changing the pressure.

The control unit may control the gas supply unit to supply a first gas during the first control and to supply a second gas different from the first gas during the second control. With this configuration, it is possible to process a target object using the same plasma processing apparatus while changing gas species and a pressure.

EFFECT OF THE INVENTION

As described above, there is provided a plasma processing apparatus capable of increasing a control range of a pressure in a space where the target object is provided.

DETAILED DESCRIPTION OF THE EMBODIMENTS

Figure 1:
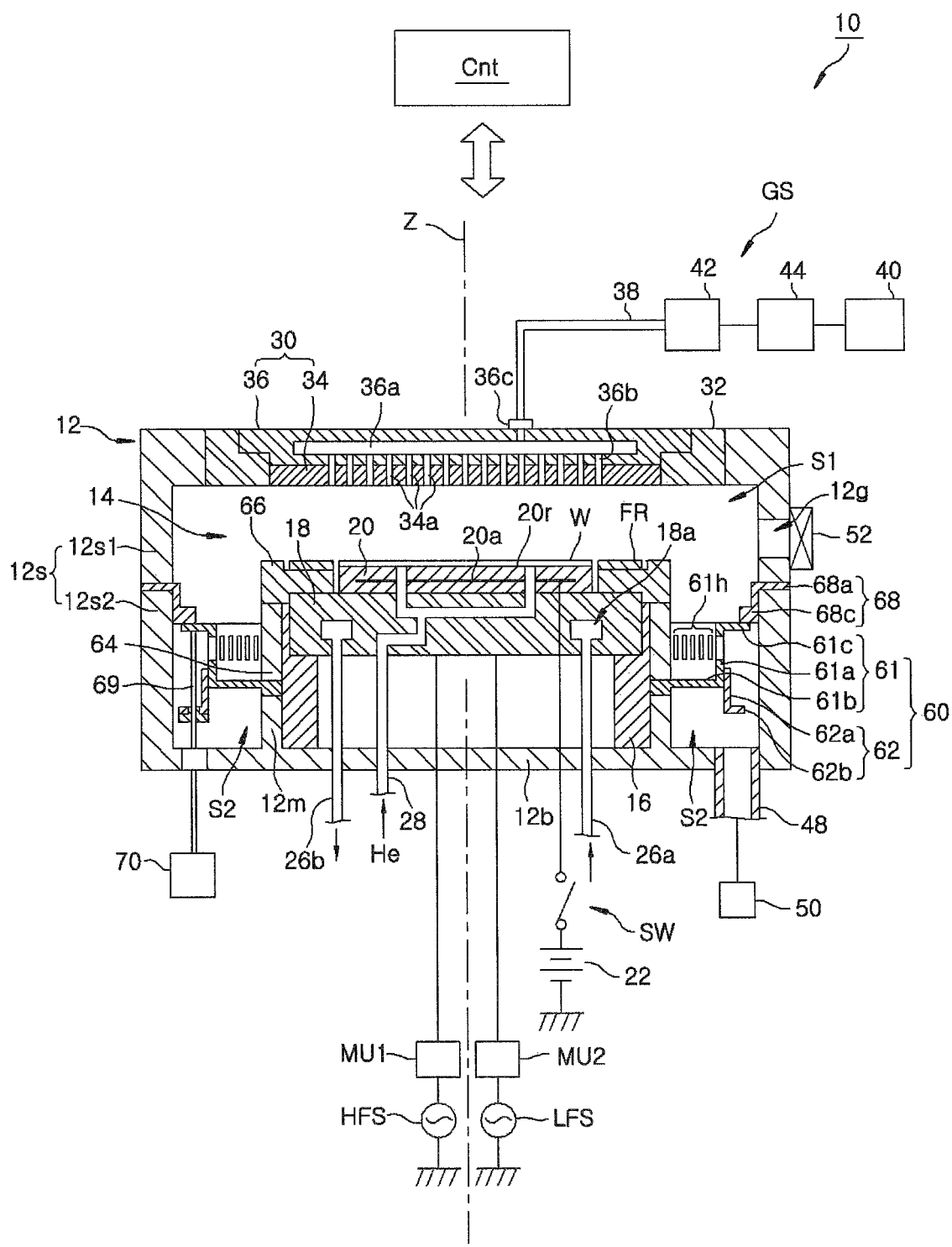
FIG. 1 schematically shows a plasma processing apparatus according to an embodiment.

Hereinafter, embodiments will be described in detail with reference to the accompanying drawings. Like reference numerals will be used for like or corresponding parts throughout the respective drawings.

FIG. 1 schematically shows a plasma processing apparatus according to an embodiment. In FIG. 1, a vertical cross sectional structure of a plasma processing apparatus 10 is schematically illustrated. The plasma processing apparatus 10 shown in FIG. 1 is a capacitively coupled parallel plate type plasma etching apparatus. The plasma processing apparatus 10 includes a processing chamber 12. The processing chamber 12 is made of, e.g., anodically oxidized aluminum. The processing chamber 12 has a sidewall 12s. The sidewall 12s has a substantially cylindrical shape. A central axis line of the sidewall 12s substantially coincides with an axis line Z extending in a vertical direction. An opening 12g through which a wafer W is loaded or unloaded is formed at the sidewall 12s. The opening 12g can be opened and closed by a gate valve 52.

A mounting table 14 is provided in the processing chamber 12. In one embodiment, the mounting table 14 is supported by a supporting portion 16. The supporting portion 16 is a substantially cylindrical insulating member extending upward from a bottom portion of the processing chamber 12. In one embodiment, the supporting portion 16 supports the mounting table 14 while being in contact with a lower peripheral portion of the mounting table 14.

The mounting table 14 includes a lower electrode 18 and an electrostatic chuck 20. The lower electrode 18 has a substantially disc shape and is made of a conductor. The lower electrode 18 is connected to a first high frequency power supply (HFS) via a matching unit MU1. The first HFS generates a high frequency power for plasma generation which has a frequency in a range from 27 MHz to 100 MHz, e.g., 40 MHz in this example. The matching unit MU1 includes a circuit for matching an output impedance of the first HFS and an input impedance of the load side (the lower electrode 18 side).

The lower electrode 18 is also connected to a second high frequency power supply (LFS) via a matching unit MU2. The second LFS generates a high frequency power for ion attraction (high frequency bias power) and supplies the high frequency bias power to the lower electrode 18. The high frequency bias power has a frequency in a range from 400 kHz to 13.56 MHz, e.g., 3 MHz in this example. The matching unit MU2 includes a circuit for matching an output impedance of the second LFS and the input impedance of the load side (the lower electrode 18 side).

The electrostatic chuck 20 is provided on the lower electrode 18. The electrostatic chuck 20 has a structure in which an electrode 20a made of a conductive film is embedded between two insulating layers or two insulating sheets. A DC power supply 22 is electrically connected to the electrode 20a via a switch SW. A top surface of the electrostatic chuck 20 serves as a mounting region 20r on which the wafer W as a processing target object is mounted. When a DC voltage from the DC power supply 22 is applied to the electrode 20a of the electrostatic chuck 20, the wafer W mounted on the mounting region 20r is attracted and held on the electrostatic chuck 20 by an electrostatic force such as a Coulomb force or the like.

In the plasma processing apparatus 10, a focus ring FR is provided to surround an edge of the wafer W. The focus ring FR may be made of, e.g., silicon or quartz.

A flow path 18a is formed in the lower electrode 18. A coolant, e.g., cooling water, is supplied to the flow path 18a from an external chiller unit through a line 26a. The coolant flowing in the flow path 18a returns to the chiller unit through a line 26b. A temperature of the wafer W mounted on the electrostatic chuck 20 is controlled by controlling a temperature of the coolant.

A gas supply line 28 is formed in the mounting table 14. The gas supply line 28 supplies a heat transfer gas, e.g., He gas, from a heat transfer gas supply unit to a gap between the top surface of the electrostatic chuck 20 and a backside of the wafer W.

The plasma processing apparatus 10 further includes an upper electrode 30. The upper electrode 30 is provided above the lower electrode 18 to face the lower electrode 18. The lower electrode 18 and the upper electrode 30 are approximately parallel to each other.

The upper electrode 30 is held at a ceiling portion of the processing chamber 12 through an insulating shield member 32. The upper electrode 30 may include an electrode plate 34 and an electrode holder 36. The electrode plate 34 is in contact with a space in the processing chamber 12 and has a plurality of gas injection openings 34a. The electrode plate 34 may be made of a semiconductor or a low-resistance conductor having low Joule's heat.

The electrode holder 36 detachably holds the electrode plate 34 and is made of a conductive material, e.g., aluminum. The electrode holder 36 has a water-cooling structure. A gas diffusion space 36a is provided in the electrode holder 36. A plurality of gas holes 36b communicating with the gas injection openings 34a extends downward from the gas diffusion space 36a. Further, the electrode holder 36 includes a gas inlet port 36c for guiding a processing gas into the gas diffusion space 36a. A gas supply line 38 is connected to the gas inlet port 36c.

A gas source group 40 is connected to the gas supply line 38 through a valve group 42 and a flow rate controller group 44. The gas source group 40 includes a plurality of different gas sources. The valve group 42 includes a plurality of valves. The flow rate controller group 44 includes a plurality of flow rate controllers such as mass flow controllers. The gas sources of the gas source group 40 are connected to the gas supply line 38 via corresponding valves of the valve group 42 and corresponding flow rate controllers of the flow rate controller group 44.

In the plasma processing apparatus 10, a gas from at least one gas source selected among a plurality of gas sources of the gas source group 40 is supplied at a controlled flow rate to the gas supply line 38 through a corresponding flow rate controller and a corresponding valve. The gas supplied to the gas supply line 38 reaches the gas diffusion space 36a and then is guided to the space in the processing chamber 12 through the gas holes 36b and the gas injection openings 34a. The gas source group 40, the flow rate controller group 44, the valve group 42, the gas supply line 38, and the upper electrode 30 constitute a gas supply unit GS according to an embodiment. The gas supply unit GS is connected to a first space S1 to be described later.

As shown in FIG. 1, a gas exhaust line 48 is connected to the bottom portion of the processing chamber 12. A gas exhaust unit 50 is connected to the gas exhaust line 48. Accordingly, the gas exhaust unit 50 is connected to a second space S2 to be described later. The gas exhaust unit 50 includes a vacuum pump such as a turbo molecular pump.

The plasma processing apparatus 10 further includes a control unit Cnt. The control unit Cnt is a computer including a processor, a storage unit, an input device, a display device and the like. The control unit Cnt controls the respective components of the plasma processing apparatus 10. The control unit Cnt can allow an operator to input commands to manage the plasma processing apparatus 10 by using the input device. The control unit Cnt can display the operation state of the plasma processing apparatus 10 on the display device. The storage unit of the control unit Cnt stores therein a control program for controlling various processes performed in the plasma processing apparatus 10, and a program, i.e., a processing recipe, for performing processes of the respective components of the plasma processing apparatus 10 based on the processing conditions.

In the plasma processing apparatus 10, in order to process the wafer W, a gas is supplied from at least one gas source selected among the plurality of gas sources of the gas source group 40 into the processing chamber 12. Further, a high frequency electric field is generated between the lower electrode 18 and the upper electrode 30 by applying the high frequency power for plasma generation to the lower electrode 18. A plasma of the gas supplied into the processing chamber 12 is generated by the high frequency electric field thus generated. The wafer W is processed, e.g., etched, by the plasma thus generated. Further, ions may be attracted to the wafer W by applying the high frequency bias power to the lower electrode 18.

As shown in FIG. 1, the plasma processing apparatus 10 further includes a baffle structure 60. The baffle structure 60 is provided at a location below the mounting region 20r and between the mounting table 14 and the sidewall 12s of the processing chamber 12. The baffle structure 60 defines the first space S1 and the second space S2 in the processing chamber 12. The first space S1 includes the mounting region 20r on which the wafer W is mounted. The second space S2 is located below the mounting region 20r. The gas supply unit GS is connected to the first space S1. The gas exhaust unit 50 is connected to the second space S2.

Figure 2:
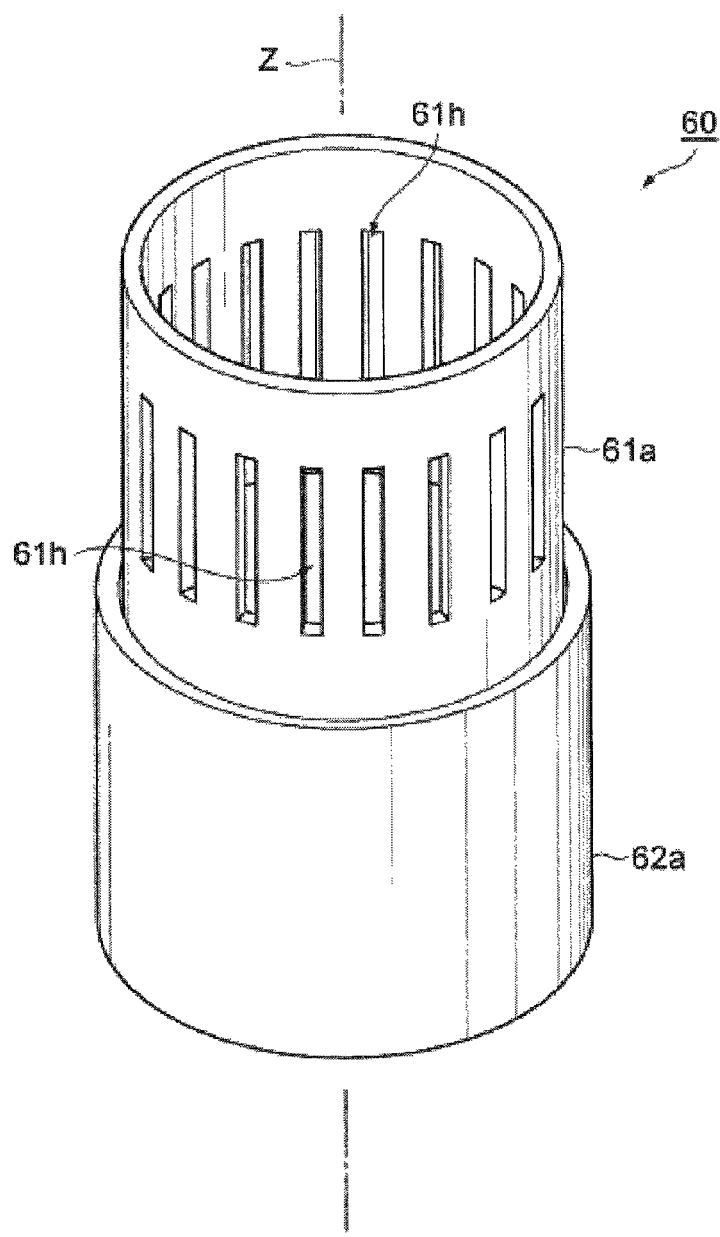
FIGS. 2 and 3 are perspective views schematically showing a first cylindrical part of a first member and a second cylindrical part of a second member of a baffle structure according to an embodiment.
Figure 3:
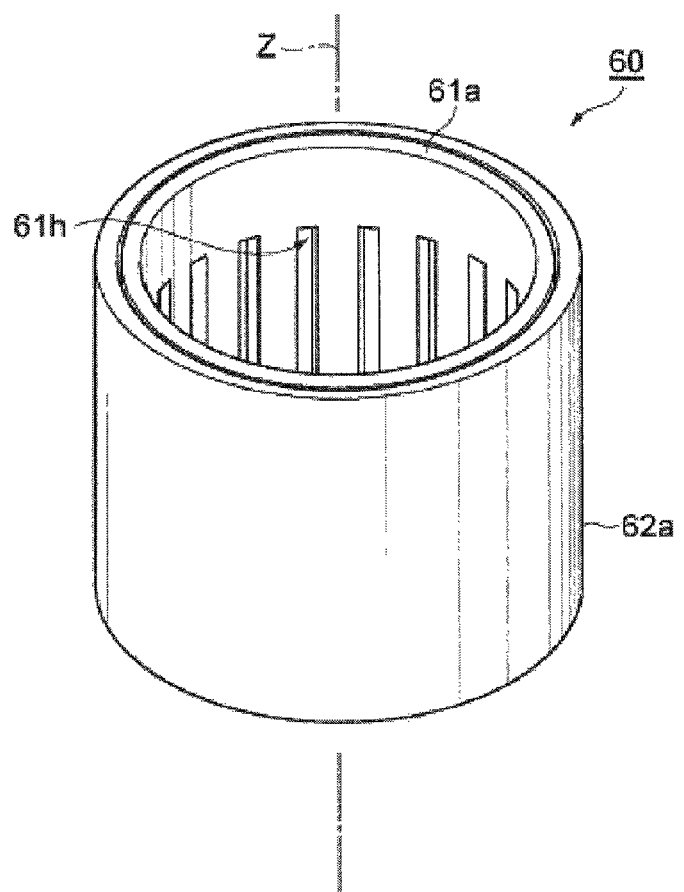
Figure 4:
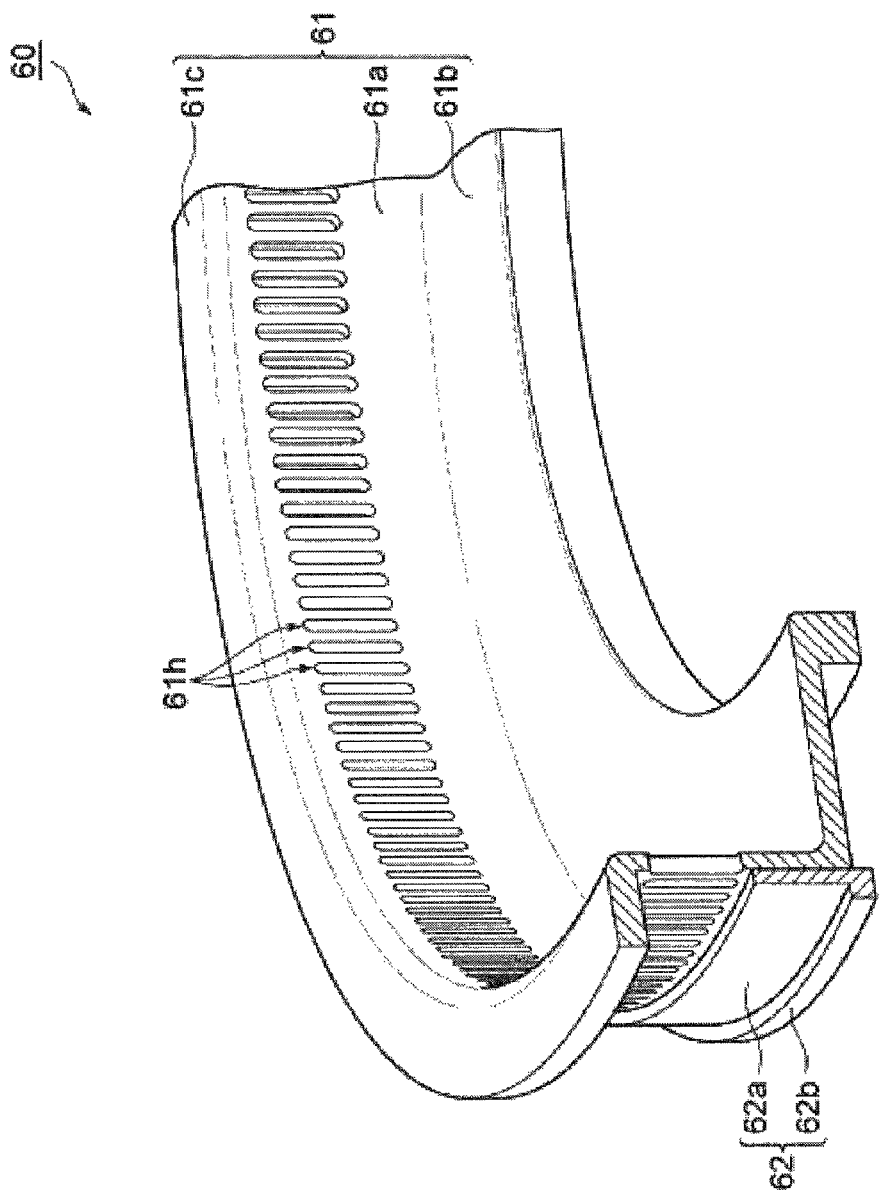
FIGS. 4 and 5 are broken perspective views showing the first member and the second member of the baffle structure according to the embodiment.
Figure 5:
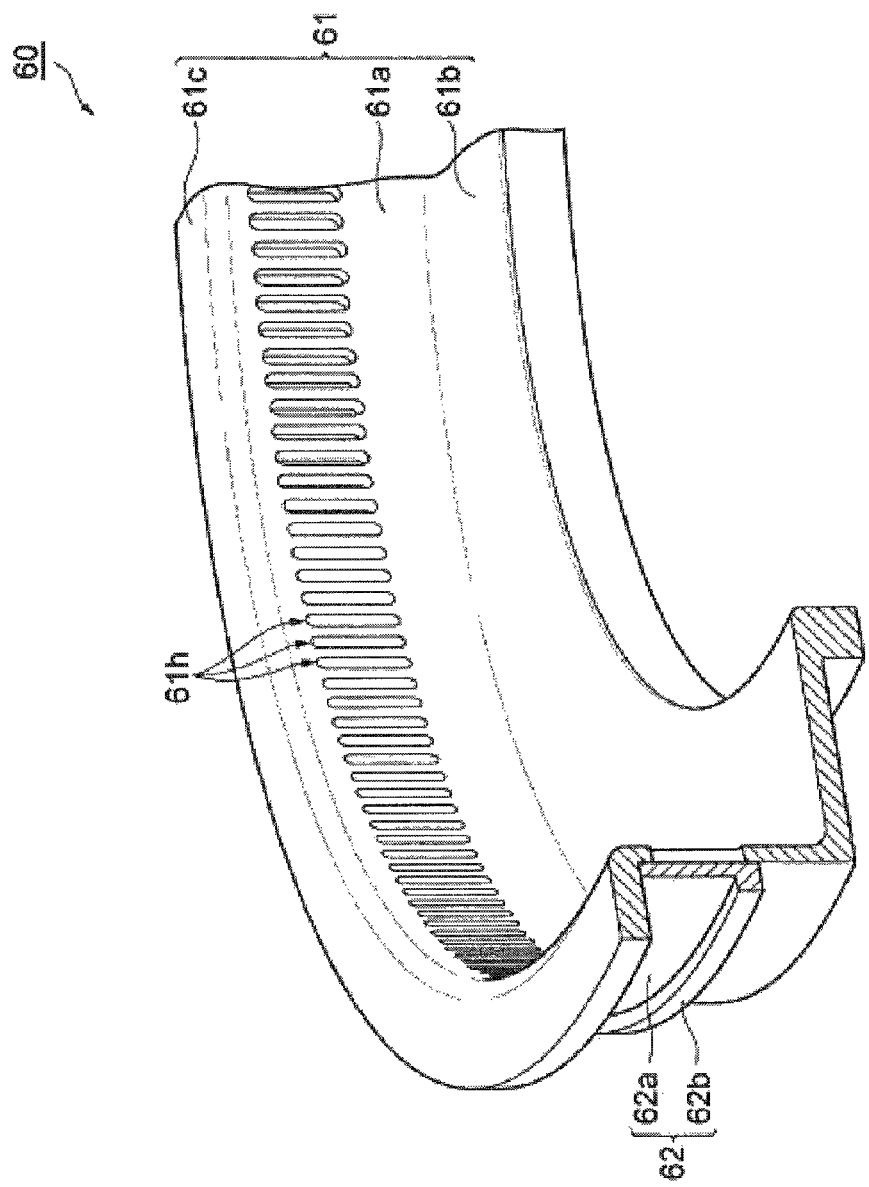
Figure 6:
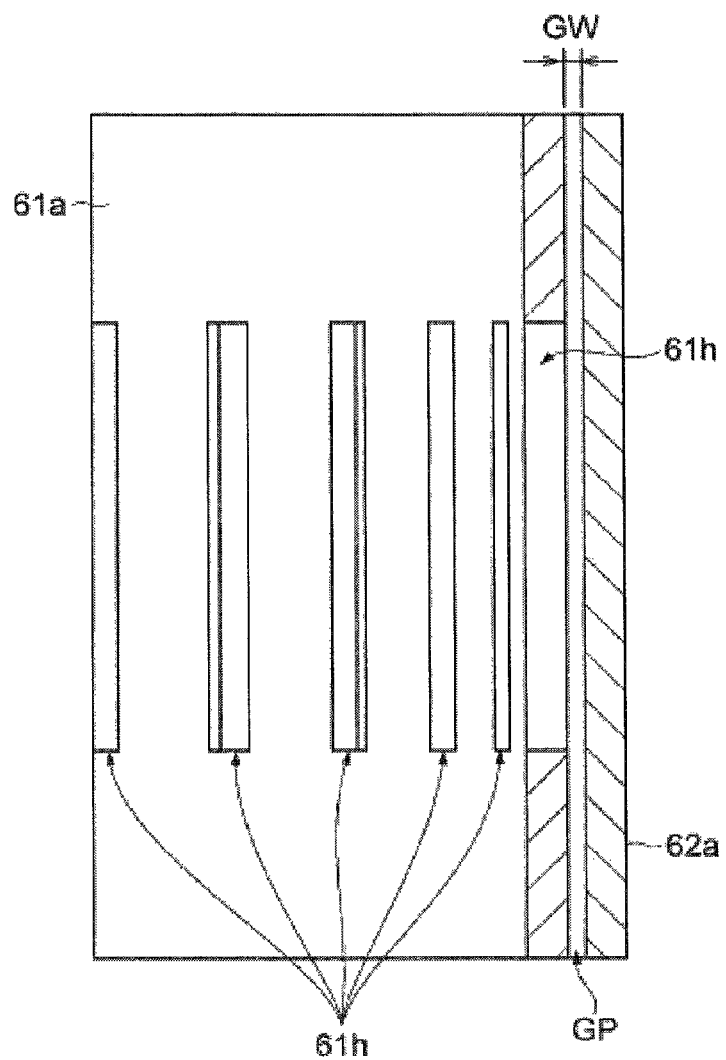
FIG. 6 is an enlarged cross sectional view showing a part of the first cylindrical part of the first member and a part of the second cylindrical part of the second member of the baffle structure according to the embodiment.

Hereinafter, FIGS. 2 to 6 as well as FIG. 1 will be referred to. FIGS. 2 and 3 are perspective views schematically showing a first cylindrical part of a first member and a second cylindrical part of a second member of the baffle structure according to an embodiment. FIGS. 4 and 5 are partial perspective views showing the first member and the second member of the baffle structure according to the embodiment. FIG. 6 is an enlarged cross sectional view showing a part of the first cylindrical part of the first member and a part of the second cylindrical part of the second member of the baffle structure according to the embodiment. FIGS. 2 and 3 are perspective views used for better description. The illustrated sizes of the first and the second cylindrical part, the illustrated size and the illustrated number of through-holes formed in the first cylindrical part are different from the actual sizes of the first and the second cylindrical part, the actual size and the actual number of the through-holes formed in the first cylindrical part.

As shown in FIGS. 1, 4 and 5, the baffle structure 60 includes a first member 61 and a second member 62. The first member 61 is formed by coating $Y_2O_3$ on a surface of a metal such as aluminum or stainless steel. The first member 61 includes a first cylindrical part 61a, a lower annular part 61b, and an upper annular part 61c.

As shown in FIGS. 1 to 5, the first cylindrical part 61a has a substantially cylindrical shape and a central axis line thereof substantially coincides with an axis line Z. A thickness of the first cylindrical part 61a is, e.g., 5 mm. An outer diameter of the first cylindrical part 61a is, e.g., 550 mm. As shown in FIG. 1, the first cylindrical part 61a extends between the mounting table 14 and the sidewall 12s of the processing chamber 12.

As shown in FIGS. 1 to 5, the first cylindrical part 61a has a plurality of through-holes 61h. The through-holes 61h penetrate through the first cylindrical part 61a in a radial direction (i.e., in a diametrical direction) with respect to the axis line Z. The through-holes 61h have a long slit shape in a vertical direction. The through-holes 61h are distributed in the entire circumference of the first cylindrical part 61a while being arranged at a substantially regular pitch in a circumferential direction with respect to the axis line Z.

A width of each of the through-holes 61h, i.e., a width in a direction perpendicular to the vertical direction of each of the through-holes 61h, may be about 3.5 mm or less in view of suppressing leakage of a plasma into the second space S2. A length in the vertical direction of each of the through-holes 61h may be set depending on a control range of a pressure in the first space S1. For example, the length in the vertical direction of each of the through-holes 61h is 30 mm.

As shown in FIGS. 1, 4 and 5, the lower annular part 61b has an annular shape. The lower annular part 61b extends from a lower end of the first cylindrical part 61a in a diametrically inward direction. The upper annular part 61c has an annular shape. The upper annular part 61c extends from an upper end of the first cylindrical part 61a in a diametrically outward direction. The first member 61 may include the first cylindrical part 61a, the lower annular part 61b and the upper annular part 61c which are separate members. In other words, the first member 61 may have a separated structure and may be formed by assembling the first cylindrical part 61a, the lower annular part 61b and the upper annular part 61c. Or, the first member 61 may be obtained by forming the first cylindrical part 61a, the lower annular part 61b and the upper annular part 61c as one unit.

As shown in FIG. 1, the bottom portion 12b of the processing chamber 12 includes a substantially cylindrical supporting portion 12m. A cylindrical member 64 is provided above the supporting portion 12m. The cylindrical member 64 may be made of an insulator, e.g., ceramic. The cylindrical member 64 extends along an outer peripheral surface of the supporting portion 16. An annular member 66 is provided on the cylindrical member 64 and the supporting portion 16. The annular member 66 extends to a vicinity of an edge of the electrostatic chuck 20 along a top surface of the lower electrode 18. The aforementioned focus ring FR is installed on the annular member 66.

An inner edge of the lower annular portion 61b of the first member 61 is disposed between the supporting portion 12m and the cylindrical member 64. The supporting portion 12m and the cylindrical member 64 are fixed to each other by, screws. Accordingly, the inner peripheral portion of the lower annular portion 61b is interposed between the supporting portion 12m and the cylindrical member 64.

The sidewall 12s of the processing chamber 12 includes an upper part 12s1 and a lower part 12s2. The plasma processing apparatus 10 further includes a supporting member 68. The supporting member 68 has a substantially annular upper part 68a and a substantially annular lower part 68c. The upper part 68a and the lower part 68c are connected via a substantially cylindrical intermediate part. The upper part 68a of the supporting member 68 is interposed between the upper part 12s1 and the lower part 12s2 of the sidewall 12s. The lower part 68c of the supporting member 68 extends in a diametrically inward direction inside the processing chamber 12. The upper annular part 61c of the first member 61 is fixed to the lower part 68c of the supporting member 68. The upper annular part 61c of the first member 61 is fixed to the lower part 68c of the supporting member 68 by, e.g., screws. The supporting member 68 may include the upper part 68a, the intermediate part, and the lower part 68c which are separate members. In other words, the supporting member 68 may have a separated structure and may be formed by assembling the upper part 68a, the intermediate part and the lower part 68c. Or, the supporting member 68 may be obtained by forming the upper part 68a, the intermediate part and the lower part 68c as one unit.

The second member 62 may be formed by coating $Y_2O_3$ on a surface of a metal, e.g., aluminum or stainless steel. As shown in FIGS. 1, 4 and 5, the second member 62 includes a second cylindrical part 62a and an annular part 62b. As shown in FIGS. 1 to 5, the second cylindrical part 62a has a substantially cylindrical shape and a central axis line thereof substantially coincides with the axis line Z. Further, the second cylindrical part 62a has an inner diameter greater than the outer diameter of the first cylindrical part 61a. For example, the inner diameter of the second cylindrical part 62a is 550.4 mm, and the thickness of the second cylindrical part 62a is 5 mm.

As shown in FIGS. 1, 4 and 5, the annular part 62b of the second member 62 has a substantially annular shape. In one embodiment, the annular part 62b extends from the lower end of the second cylindrical part 62a in a diametrically outward direction. The second member 62 may include the second cylindrical part 62a and the annular part 62b which are separate members. In other words, the second member 62 may have a separated structure and may be formed by assembling the second cylindrical part 62a and the annular part 62b. Or, the second member 62 may be obtained by forming the second cylindrical part 62a and the annular part 62b as one unit. As shown in FIG. 1, the annular part 62b of the second member 62 is connected to a shaft body 69. In one embodiment, the shaft body 69 is a feed screw. The annular part 62b is connected to the shaft body 69 via a nut. Further, the shaft body 69 is connected to a driving unit 70. The driving unit 70 is, e.g., a motor. The driving unit 70 vertically moves the second member 62 along the shaft body 69. Accordingly, the second cylindrical part 62a of the second member 62 is vertically moved in a region including a gap between the first cylindrical part 61a of the first member 61 and the sidewall 12s of the processing chamber 12. Although only one shaft body 69 is illustrated in FIG. 1, a plurality of shaft bodies arranged in a circumferential direction may be connected to the annular part 62b of the second member 62.

Figure 7:
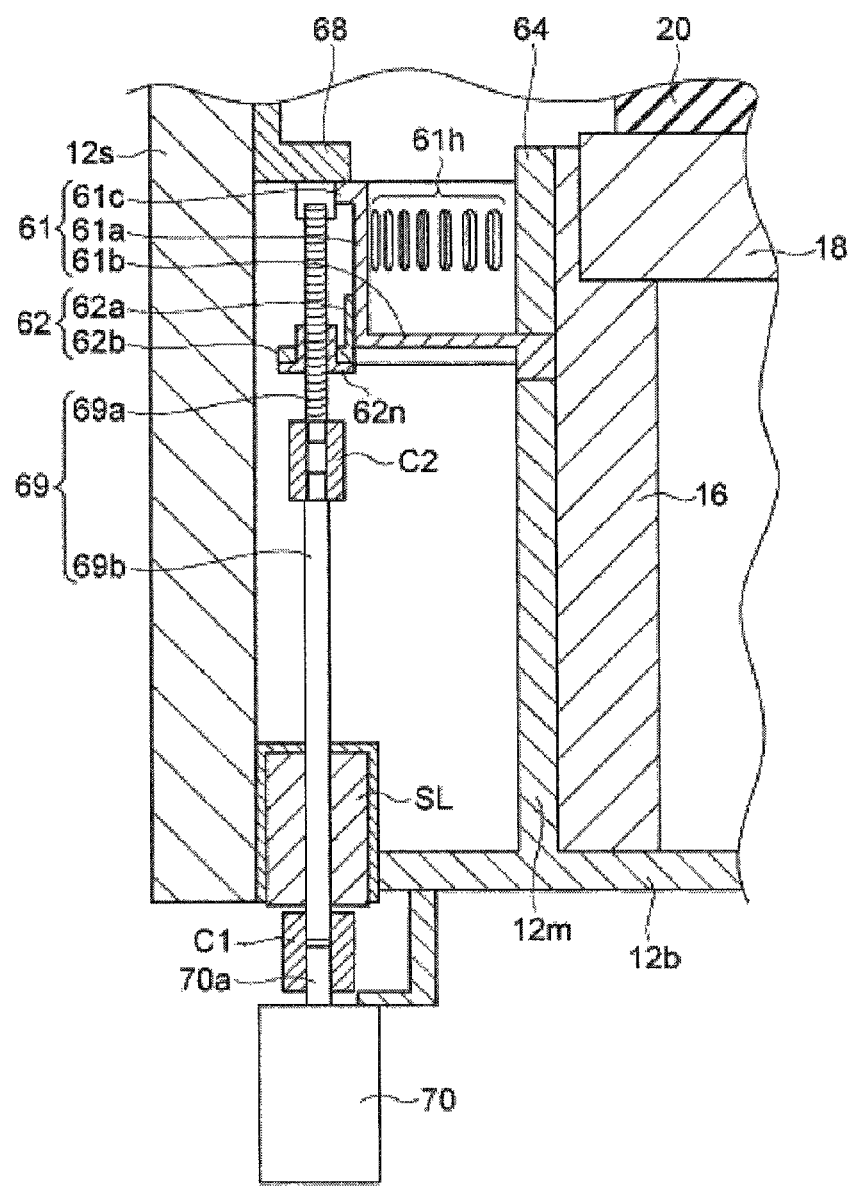
FIG. 7 is a cross sectional view showing examples of the first member, the second member and a shaft body.
Figure 8:
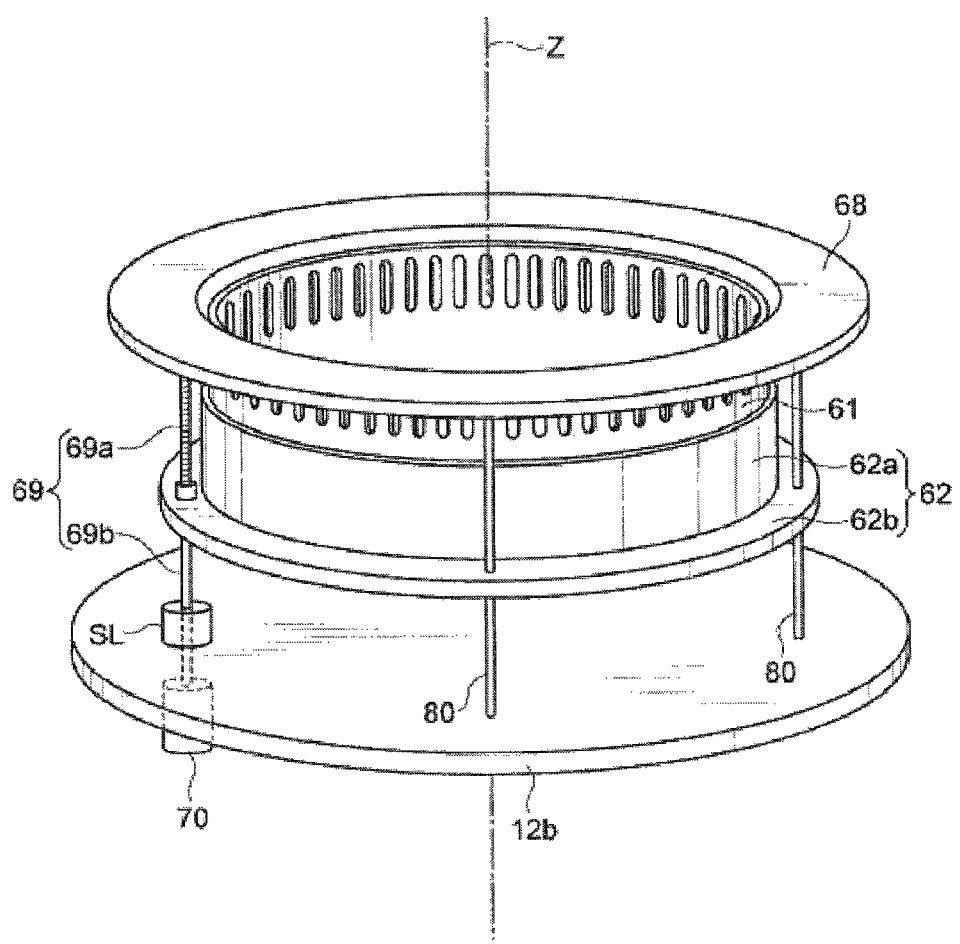
FIG. 8 is a perspective view schematically showing an example of a mechanism for vertically moving the second member.

Hereinafter, FIGS. 7 and 8 will be referred to. FIG. 7 is a cross sectional view showing examples of the first member, the second member, and the shaft body. FIG. 8 is a perspective view schematically showing an example of a mechanism for vertically moving the second member. Hereinafter, the example of the mechanism for vertically moving the second member will be described with reference to FIGS. 7 and 8. In FIG. 8, components such as connectors C1 and C2 to be described later are not illustrated.

As shown in FIG. 7, the shaft body 69 includes a screw part 69a, a shaft 69b, the connector C1, and the connector C2. The shaft 69b has a substantially columnar shape and extends in a vertical direction. An upper end of the shaft 69b is positioned inside the processing chamber 12, and a lower end of the shaft 69b is positioned outside the processing chamber 12 while penetrating through the bottom portion 12b of the processing chamber 12. The lower end of the shaft 69b is connected to a rotational driving axis 70a of the driving unit 70 (e.g., a motor) via the connector C1. A sealing unit SL such as magnetic fluid seal is provided between the shaft 69b and the bottom portion 12b of the processing chamber 12.

The upper end of the shaft 69b is connected to a lower end of the screw part 69a via the connector C2. The screw part 69a extends in a vertical direction above the shaft 69b. A nut 62n to be screw-coupled to the screw part 69a is attached to the annular part 62b of the second member 62. When the shaft body 69 is rotated by the driving unit 70, the rotation of the shaft body 69 is converted to vertical movement of the second member 62. Therefore, a mechanism illustrated in FIG. 7 can vertically move the second member 62.

The screw part 69a, the shaft 69b, and the connector C2, and the nut 62n which form the shaft body 69 shown in FIG. 7 is provided inside the processing chamber 12. Therefore, all or at least one of the shaft 69b, and the connector C2, and the nut 62n may be made of an insulator. Or, only the screw part 69a that is a component located at a position closest to the first space S1 where the plasma is generated may be made of an insulator.

In one example, one or more shaft bodies 80 may be provided in addition to the shaft body 69 as shown in FIG. 8. The shaft body 80 has a substantially columnar shape and extends in a vertical direction through a through-hole formed in the annular part 62b of the second member 62. A bearing may be provided between the shaft body 80 and the annular part 62b of the second member 62. A lower end of the shaft 80 may be fixed to the bottom portion 12b of the processing chamber 12 and an upper end of the shaft 80 may be fixed to the supporting member 68. The shaft bodies 80 and the shaft body 69 are arranged in the circumferential direction with respect to the axis line Z. For example, the shaft body 69 and three shaft bodies 80 (two shaft bodies 80 are illustrated in FIG. 8) may be arranged in the circumferential direction while being spaced apart from each other at an angle of 90°. By providing the shaft 69 and one or more shaft bodies 80, the vertical movement of the second member 62 can be realized with high accuracy. The number of the shaft bodies 80 is not limited to three. A plurality of mechanisms, each including the shaft body 69, the connector C1, the connector C2, the sealing unit SL, and the driving unit 70, may be arranged in the circumferential direction.

As shown in FIGS. 2 and 4, in the plasma processing apparatus 10, when the second cylindrical part 62a is moved downward, the through-holes 61h formed in the first cylindrical part 61a are made to directly communicate with the second space S2 without facing the second cylindrical part 62a, i.e., without being shielded by the second cylindrical part 62a. In other words, the first space S1 communicates with the second space S2 only through the through-holes 61h. In that state, a conductance of a gas channel between the first space S1 and the second space S2 is increased. Therefore, a pressure in the first space S1 becomes close to a pressure in the second space S2, and the pressure in the first space S1 can be set to a low level.

As shown in FIGS. 3, 5 and 6, when the second cylindrical part 62a is moved upward and made to face the through-holes 61h, i.e., when the through-holes 61h are shielded by the second cylindrical part 62a, the first space S1 communicates with the second space S2 via the through-holes 61h and a gap GP (see FIG. 6) between the first cylindrical part 61a and the second cylindrical part 62a. In that state, the conductance of the gas channel between the first space S1 and the second space S2 is decreased. Therefore, a difference between the pressure in the first space S1 and the pressure in the second space S2 is increased and the pressure in the first space S1 can be set to a high level. A length GW in a diametrical direction of the gap GP between the first cylindrical part 61a and the second cylindrical part 62a may be set to, e.g., 0.4 mm.

Figure 9:
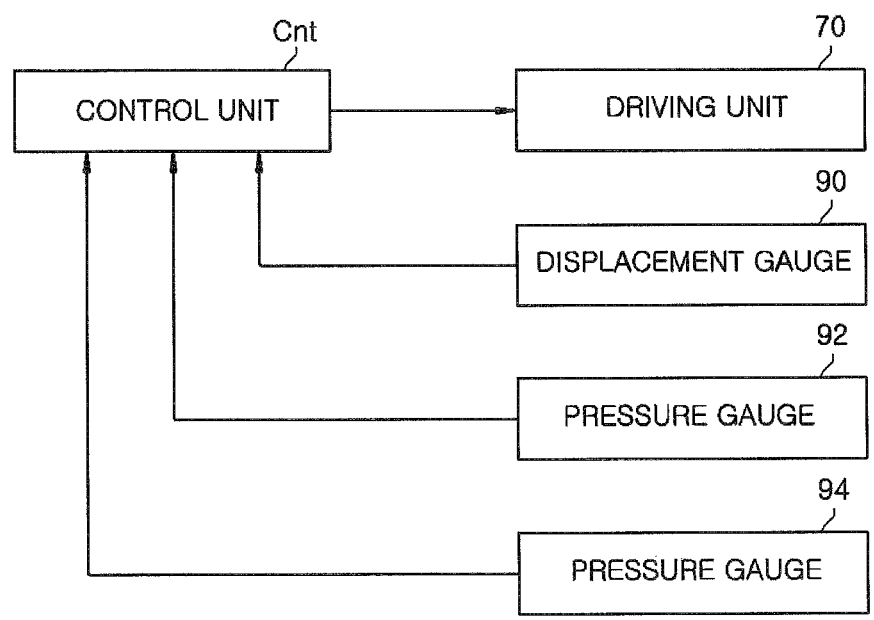
FIG. 9 shows an embodiment of a control system related to the baffle structure.

FIG. 9 shows an embodiment of a control system related to the baffle structure. As shown in FIG. 9, the driving unit 70 can be controlled by the control unit Cnt. The control unit Cnt receives signals from a displacement gauge 90, a pressure gauge 92, and a pressure gauge 94. The displacement gauge 90 measures a vertical position of the second member 62 or a distance from a reference position and sends a signal indicating the measurement result to the control unit Cnt. The pressure gauge 92 measures a pressure in the first space S1 and sends a signal indicating the measurement result to the control unit Cnt. The pressure gauge 94 measures a pressure in the second space S2 and sends a signal indicating the measurement result to the control unit Cnt. The control unit Cnt receives the pressure in the first space S1 which is specified by a recipe, the signal indicating the measurement result of the displacement gauge 90, the signal indicating the measurement result of the pressure gauge 92, and the signal indicating the measurement result of the pressure gauge 94, sends a signal to the driving unit 70, and controls the vertical position of the second member 62 by using the driving unit 70 such that the pressure in the first space S1 becomes the pressure specified by the recipe.

In this plasma processing apparatus 10, it is possible to control a ratio in which the through-holes 61h are shielded with respect to the second space S2 by the second cylindrical part 62a by controlling a vertical positional relationship between the first cylindrical part 61a of the first member 61 and the second cylindrical part 62a of the second member 62. Accordingly, the conductance between the first space S1 and the second space S2 can be controlled.

In a state where the second cylindrical part 62a faces the entire through-holes 61h, the conductance between the first space S1 and the second space S2 is mainly determined by the conductance of the gap GP between the two cylindrical parts. Therefore, a small conductance between the first space S1 and the second space S2 can be obtained regardless of the length in a diametrical direction of the gap GP between the first cylindrical part 61a of the first member 61 and the second cylindrical part 62a of the second member 62, i.e., without requiring a high accuracy for the gap GP. In a state where the second cylindrical part 62a does not face the through-holes 61h, a large conductance between the first space S1 and the second space S2 can be obtained. Accordingly, in the plasma processing apparatus 10, it is possible to increase a control range of a pressure in the first space S1 where the wafer W is disposed.

Although the pressure is applied to the first member 61 and the second member 62 in the diametrical direction, the first member 61 and the second member 62 are hardly bent by the pressure due to the cylindrical shape thereof. Therefore, even if the second member 62 is moved, the first cylindrical part 61a and the second cylindrical part 62a are hardly brought into contact with each other and, thus, generation of particles can be suppressed. Further, the second member 62 can be moved at a high speed due to its thin thickness. Since the through-holes 1h are arranged in the circumferential direction, non-uniformity of a gas exhaust amount in the circumferential direction can be reduced.

In the plasma processing apparatus 10, an exemplary plasma processing to be described later can be performed. In a first exemplary plasma processing, the control unit Cnt performs first control and second control. In the first control, the control unit Cnt controls the driving unit 70 such that the vertical position of the second member 62 is set to a first position. In the second control, the control unit Cnt controls the driving unit 70 such that the vertical position of the second member 62 is set to a second position different from the first position. The first position may be positioned above the second position or below the second position. In the first exemplary plasma processing, the wafer W can be processed in the first space S1 by moving the second member 62 to the first position during the first control to set the pressure in the first space S1 to one of a high level and a low level. Further, the wafer W can be processed in the first space S1 by moving the second member 62 to the second position during the second control to set the pressure in the first space S1 to the other one of the high level and the low level. The first control and the second control may be repeated alternately.

In a second exemplary plasma processing, the control unit Cnt supplies a first gas to the gas supply unit GS during the first control and supplies a second gas to the gas supply unit GS during the second control. The second gas is different from the first gas. In other words, the second gas has a different composition from that of the first gas. In the second exemplary plasma processing, the first control and the second control may be repeated alternately.

In the second exemplary plasma processing, a deposition gas is used as the first gas and a corrosion gas is used as the second gas and, thus, a process of depositing a protective film on the wafer W and a process of etching a film of the wafer W can be performed alternately. In this plasma processing, a pressure set as the pressure in the first space S1 in the deposition process is different from a pressure set as the pressure in the first space S1 in the etching process. By performing the first control and the second control alternately, the plasma processing can be performed in the same plasma processing apparatus 10. In the plasma processing apparatus 10, it is possible to shorten a transition time required to change a pressure in the first space S1 between the deposition process and the etching process.

The second exemplary plasma processing can also be used for continuously etching two different films of the wafer W. In the case of etching two different films, a type of a gas and a pressure in the first space S1 which are used for etching one of the films are different from a type of a gas and a pressure in the first space S1 which are used for etching the other film. Therefore, by alternately performing the first control and the second control, such a plasma processing can be performed in the same plasma processing apparatus 10. Further, in the plasma processing apparatus 10, it is possible to shorten the transition time for changing a pressure in the first space S1 which is required to switch the etching of one film to the etching of the other film.

While the embodiment has been described, the present disclosure may be variously modified without being limited to the above-described embodiment. For example, the shape of the through-holes 61h formed in the first cylindrical part 61a may vary as long as it is vertically long. For example, the through-holes 61h may have an inverted triangle shape whose width becomes narrow in a downward direction. Or, the through-holes 61h may have a ridge shape.

The moving speed of the second member 62 by the driving unit 70 may be constant or may be changed nonlinearly. Accordingly, the pressure in the first space S1 can be changed linearly or nonlinearly during the movement of the second member 62.

In the above-described embodiment, the driving unit 70 is a motor and moves the second member 62 by driving the shaft body 69 that is a feed screw. However, the driving unit 70 may be a hydraulic or a pneumatic cylinder for vertically moving the second member 62.

In the plasma processing apparatus 10 of the above-described embodiment, the first high frequency power supply HFS is electrically connected to the lower electrode 18. However, the first high frequency power supply HFS may be electrically connected to the upper electrode 30.

The plasma processing apparatus 10 of the above-described embodiment is a capacitively coupled plasma processing apparatus. However, the plasma processing apparatus to which the idea disclosed in the above embodiment is applicable may be any plasma processing apparatus, e.g., an inductively coupled plasma processing apparatus, or a plasma processing apparatus using a surface wave such as a microwave.

Hereinafter, simulations and test examples that have been performed to check the plasma processing apparatus 10 will be described.

Simulation 1 and Comparative Simulation 1

In simulation 1, a pressure in the first space S1 and a pressure in the second space S2 were calculated under the following conditions. In the following, "shielded state" indicates a state in which the second cylindrical part 62a faces the entire through-holes 61h and the through-holes 61h are shielded by the second cylindrical part 62a.

<Conditions of Simulation 1>
  outer diameter of the first cylindrical part 61a: 550 mm
  thickness of the first cylindrical part 61a: 5 mm
  width of the through-hole 61h: 3.5 mm
  length of the through-hole 61h: 30 mm
  thickness of the second cylindrical part 62a: 5 mm
  inner diameter of the second cylindrical part 62a: 550.4 mm
  gas supply by the gas supply unit GS: $N_2$ gas (200 sccm)
  state of the through-hole 61h: shielded state As a result of the simulation 1, a pressure in the first space S1 was 420 mTorr ($5.6 \times 10^1$ Pa) and a pressure in the second space S2 was 19.5 mTorr (2.6 Pa). Therefore, in the plasma processing apparatus 10, it is possible to increase the difference between the pressure in the first space S1 and the pressure in the second space S2. As a result, the pressure in the first space S1 can be set to a high level.

Figure 10:
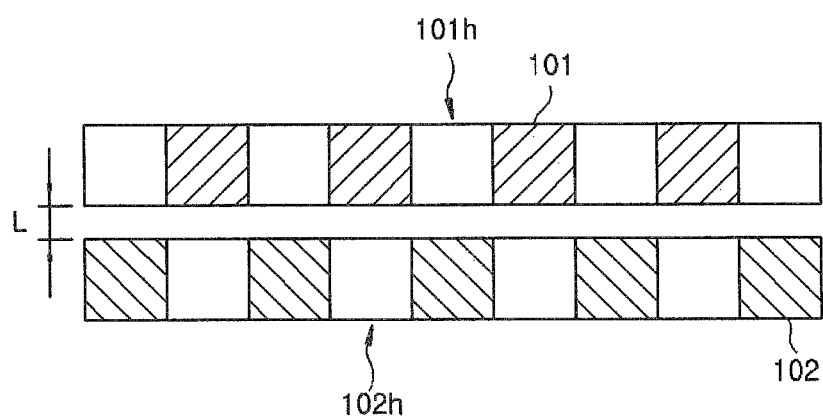
FIG. 10 explains a comparative simulation 1.

A comparative simulation 1 to be described below was performed for comparison. In the comparative simulation 1, in the baffle structure 60 of the plasma processing apparatus 10, annular baffle plates 101 and 102 extending in a horizontal direction were provided between the mounting table 14 and the sidewall 12s of the processing chamber 12. In the comparative simulation 1, the baffle plates 101 and 102 were arranged in a vertical direction. FIG. 10 explains the comparative simulation 1. The circumferential direction corresponds to the horizontal direction in FIG. 10. In FIG. 10, the baffle plates 101 and 102 are illustrated.

In the comparative simulation 1, the thickness of each of the baffle plates 101 and 102 was set to 3.5 mm. In the baffle plate 101 disposed above the baffle plate 102, 3000 through-holes 101h, each having a diameter of 3.5 mm, were formed, and 200 pairs of through-hole groups, each including 15 through-holes 101h arranged in a diametrical direction, were uniformly arranged in the circumferential direction. In the baffle plate 102, 200 through-holes 102h, each having an elongated hole shape in the diametrical direction, were arranged at a uniform pitch along the circumferential direction. A diametrical length of the through-hole 102h was set to 60 mm, and a width of the through-hole 102h was set to 3.5 mm. A pressure in the first space S1 was calculated while varying a flow rate of $N_2$ gas in the case of setting a length L of the gap between the baffle plates 101 and the baffle plate 102 to 0.1 mm and in the case of setting the length L of the gap between the baffle plates 101 and the baffle plate 102 to 0.6 mm.

Figure 11:
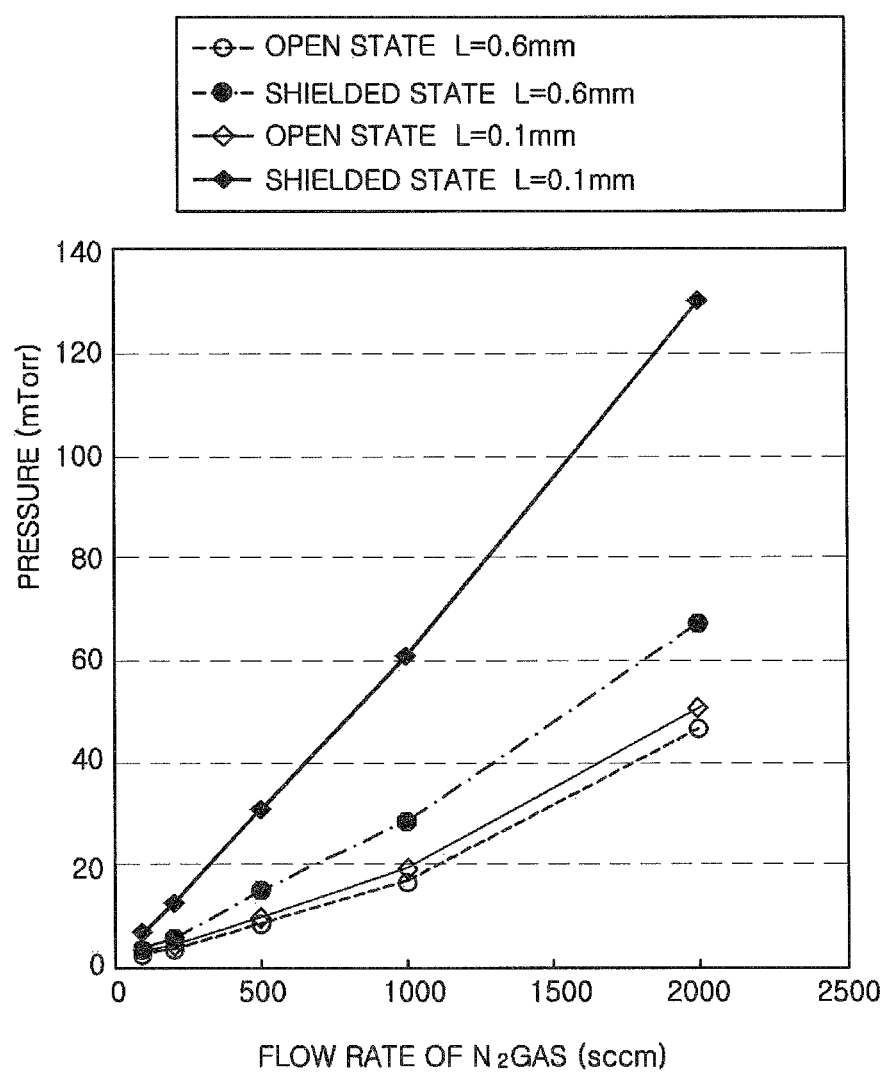
FIG. 11 shows a result of the comparative simulation 1.

FIG. 11 shows a result of the comparative simulation 1. In FIG. 11, the horizontal axis represents a flow rate of $N_2$ gas and the vertical axis represents a pressure in the first space S1. Further, in FIG. 11, "shielded state" shows a state in which the through-holes 101h of the baffle plate 101 and the through-holes 102h of the baffle plate 102 do not face each other as shown in FIG. 10, and "open state" indicates a state in which the through-holes 102h of the baffle plate 102 face the entire through-holes 101h of the baffle plate 101. In FIG. 11, a notation L indicates a length of the gap between the baffle plate 101 and the baffle plate 102.

As shown in FIG. 11, when the length L of the gap between the baffle plate 101 and the baffle plate 102 was 0.6 mm, the pressure in the first space S1 was increased only up to about 70 mTorr (9.333 Pa) even by supplying a large amount of $N_2$ gas in the shielded state. When the length L of the gap between the baffle plate 101 and the baffle plate 102 was 0.1 mm, the pressure in the first space S1 was increased up to about 130 mTorr (17.33 Pa) by supplying a large amount of $N_2$ gas in the shielded state. However, even when the length L of the gap between the baffle plate 101 and the baffle plate 102 was 0.1 mm, the pressure in the first space S1 was considerably lower than the pressure in the first space S1 which was obtained in the simulation 1 of the plasma processing apparatus 10. If the length L of the gap between the baffle plate 101 and the baffle plate 102 is set to 0.1 mm, the baffle plates 101 and 102 are brought into contact with each other, which is not practical. From the above, the superiority of the plasma processing apparatus 10 has been confirmed.

Simulation 2 and Comparative Simulation 2

In a simulation 2, in the plasma processing apparatus 10 including the baffle structure 60 having the first and the second cylindrical part 61a and 62a having the same sizes as those set in the simulation 1, a gain G was obtained in the case of supplying $N_2$ gas of 50 sccm into the processing chamber 12 and setting a frequency for alternately switching the open state and the shielded state (hereinafter, simply referred to as "frequency") to various levels. The "open state" is a state in which the through-holes 61h do not face the second cylindrical part 62a. The "gain G" is defined in the following Eq. (1). In the following Eq. (1), ΔP indicates a difference between a pressure in the first space S1 in the shielded state and a pressure in the first space S1 in the open state, and "maximum pressure difference" indicates a maximum pressure difference in the first space S1 which is realized by the vertical movement of the second member 62 in the case of supplying $N_2$ gas of 50 sccm into the processing chamber 12.

$$G = \log_{20}(\Delta P/(\text{maximum pressure difference})) \quad \text{Eq. (1)}$$

A comparative simulation 2 was performed for comparison with the simulation 2. In the comparative simulation 2, in a plasma processing apparatus different from the plasma processing apparatus 10 in that an annular baffle plate was provided between the sidewall 12s of the processing chamber 12 and the mounting table 14 instead of the baffle structure 60, a gain G was obtained while setting a frequency for alternately switching the shielded state and the open state to various levels by controlling an opening degree of the pressure control valve of the gas exhaust unit 50. In the comparative simulation 2, an inner diameter of the baffle plate was set to 400 mm; an outer diameter of the baffle plate was set to 520 mm; and a thickness of the baffle plate was set to 6 mm. As for the baffle plate, an annular plate having uniformly distributed 6000 through-holes, each having a diameter of 3 mm, was used. In the comparative simulation 2, a state in which the opening degree of the pressure control valve of the gas exhaust unit 50 was minimum was set to the shielded state and a state in which the opening degree of the pressure control valve of the gas exhaust unit 50 was maximum was set to the open state.

Figure 12:
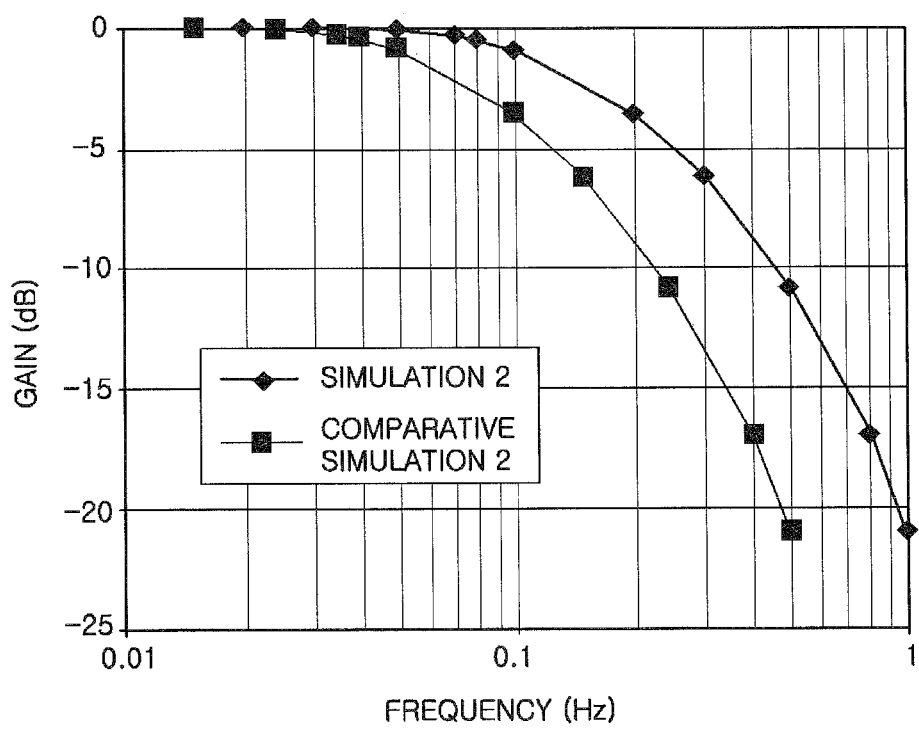
FIG. 12 shows results of a simulation 2 and a comparative simulation 2.

FIG. 12 shows the results of the simulation 2 and the comparative simulation 2. In FIG. 12, the horizontal axis represents a frequency for switching the open state and the shielded state, and the vertical axis represents the gain G. As shown in FIG. 12, the amount of decrease in the gain caused by the increase of the frequency was greater in the simulation 2 in which the open state and the shielded state were alternately switched by the baffle structure 60 than in the comparative simulation 2 in which the open state and the shielded state were alternately switched by controlling the opening degree of the pressure control valve of the gas exhaust unit 50. In the simulation 2, the gain was substantially not decreased even when the frequency was 0.1 kHz, and a gain of −20 Db was obtained even when the frequency was 1 kHz. This shows that the pressure can be greatly increased/decreased at a high frequency in the plasma processing apparatus 10.

Test Example 1 and Comparative Test Example 1

In a test example 1, $N_2$ gas of 500 sccm was supplied into the processing chamber 12 and the open state was switched to the shielded state by the movement of the second member 62 in the plasma processing apparatus 10 including the first cylindrical part 61a and the second cylindrical part 62a having the same sizes as those set in the simulation 1. Then, temporal changes of the pressure in the first space S1 were monitored. Further, a pressure increasing time in the first space S1 and a pressure settling time in the first space S1 were obtained. The pressure increasing time is a period of time between when the amount of increase in the pressure in the first space S1 from an initial pressure reaches 10% of a pressure difference between the initial pressure and a target pressure in the first space S1 and when the amount of increase in the pressure in the first space S1 reaches 90% of the pressure difference between the initial pressure and the target pressure. The pressure settling time is a period of time between when the shielded state is formed and when the pressure in the first space S1 is substantially not changed.

In the comparative test example 1, $N_2$ gas of 500 sccm was supplied into the processing chamber 12 of a plasma processing apparatus different from the plasma processing apparatus 10 of the test example 1 in that the baffle structure 60 had the baffle plate of the simulation 2, and the open state was switched to the shielded state by controlling the pressure control valve of the gas exhaust unit 50. Then, temporal changes of the pressure in the first space S1 were monitored. Further, the pressure increasing time in the first space S1 and the pressure settling time in the first space S1 were obtained. In the comparative test example 1, a state in which the opening degree of the pressure control valve of the gas exhaust unit 50 was minimum was set to the shielded state, and a state in which the opening degree of the pressure control valve of the gas exhaust unit 50 was maximum was set to the open state.

Figure 13:
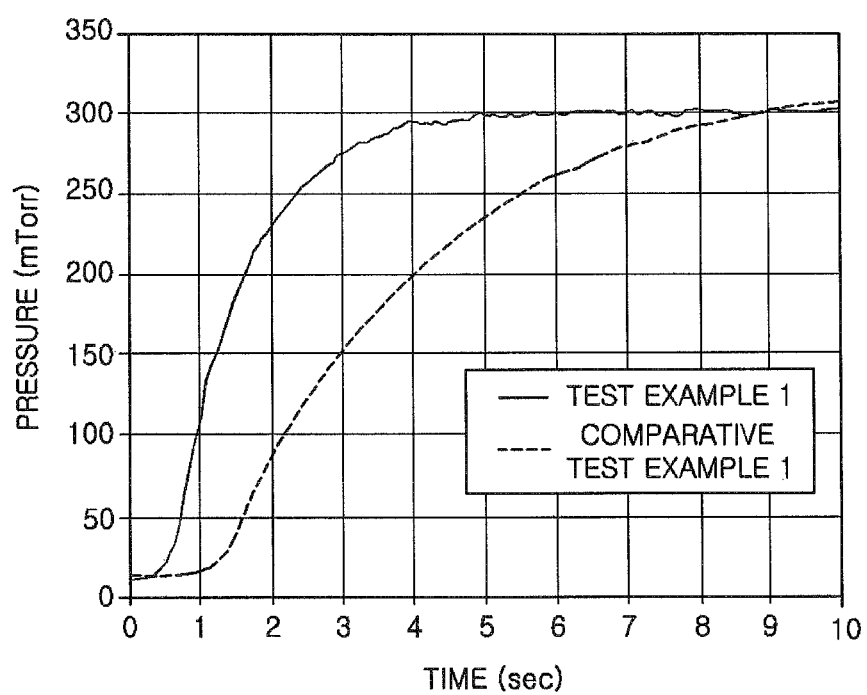
FIG. 13 is a graph showing results of a test example 1 and a comparative example 1.

FIG. 13 is a graph showing the results of the test example 1 and the comparative test example 1. In FIG. 13, the horizontal axis represents time and the vertical axis represents the pressure in the first space S1. In FIG. 13, the temporal changes of the pressure in the first space S1 of the test example 1 and the temporal changes of the pressure in the first space S1 of the comparative test example 1 are illustrated. As clearly can be seen from FIG. 13, when the open state was switched to the shielded state, the speed of the increase in the pressure in the first space S1 was higher and the pressure settling time in the shielded state was considerably shorter in the test example 1 than in the comparative example 1. Specifically, the pressure settling time and the pressure increasing time of the comparative test example 1 were 13.5 sec and 6.7 sec, respectively. The pressure settling time and the pressure increasing time of the test example 1 were 4.6 sec and 2.3 sec, respectively.

Test Example 2 and Comparative Test Example 2

In a test example 2, $N_2$ gas of 500 sccm was supplied into the processing chamber 12 of the plasma processing apparatus same as that in the test example 1, and the pressure in the first space S1 was changed by the movement of the second member 62 from 20 mTorr higher than the pressure in the first space S1 in the open state of the test example 1 to 120 mTorr lower than the pressure in the first space S1 in the shielded state of the test example 1. Then, temporal changes of the pressure in the first space S1 were monitored. Further, a pressure settling time in the first space S1 and a pressure increasing time in the first space S1 were obtained. The pressure increasing time is a period of time between when the amount of increase in the pressure in the first space S1 from an initial pressure reaches 10% of a pressure difference between the initial pressure and a target pressure in the first space S1 and when the amount of increase in the pressure in the first space S1 reaches 90% of the pressure difference between the initial pressure and the target pressure. The pressure settling time is a period of time between when the shielded state is formed and when the pressure in the first space S1 is substantially not changed.

In the comparative test example 2, $N_2$ gas of 500 sccm was supplied into the processing chamber 12 of the plasma processing apparatus same as that in the comparative example 1, and the pressure in the first space S1 was changed from 20 mTorr to 120 mTorr by controlling the pressure control valve of the gas exhaust unit 50. Then, temporal changes of the pressure in the first space S1 were monitored. Further, a pressure settling time in the first space S1 and a pressure increasing time in the first space S1 were obtained.

Figure 14:
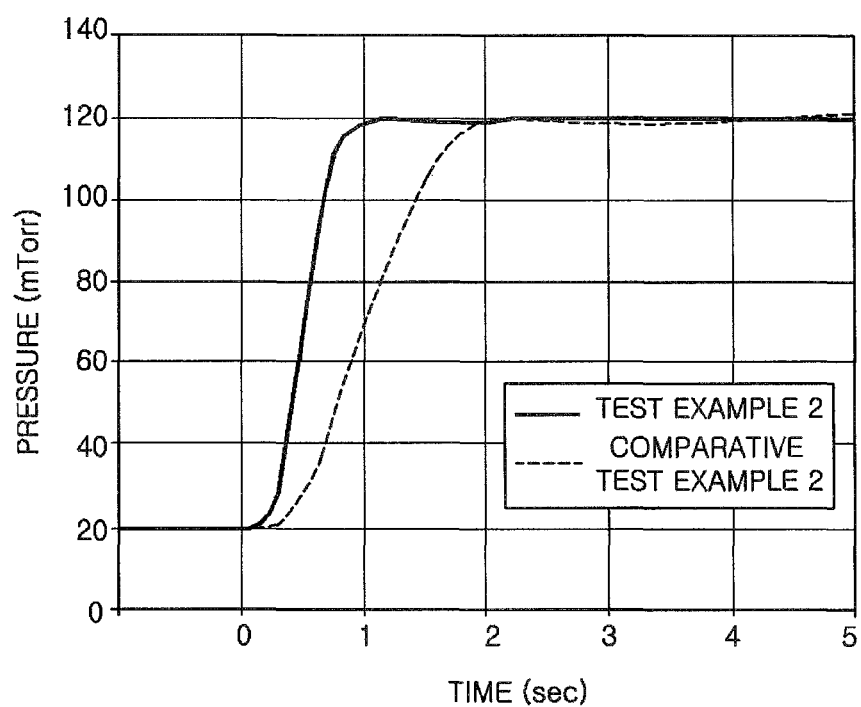
FIG. 14 is a graph showing results of a test example 2 and a comparative example 2.

FIG. 14 shows the results of the test example 2 and the comparative example 2. In FIG. 14, the horizontal axis represents time, and the vertical axis represents the pressure in the first space S1. In FIG. 14, temporal changes of the pressure in the first space S1 of the test example 2 and temporal changes of the pressure in the first space S1 of the comparative example 2 are illustrated. As clearly can be seen from FIG. 14, the speed of the increase in the pressure in the first space S1 was higher and the time for the pressure in the first space S1 to settle to 120 mTorr was shorter in the test example 2 than in the comparative example 2. Specifically, the pressure settling time and the pressure increasing time of the comparative example 2 were 1.92 sec and 1.09 sec, respectively. The pressure settling time and the pressure increasing time of the test example 1 were 0.93 sec and 0.42 sec, respectively.

Test Example 3 and Comparative Example 3

In a test example 3, the same plasma processing apparatus as that in the test example 1 was used, and the relation between the flow rate of $N_2$ gas supplied into the processing chamber 12 and the pressure in the first space S1 in each of the open state and the shielded state was obtained.

In the comparative example 3, the same plasma processing apparatus as that in the comparative example 1 was used, and the relation between the flow rate of $N_2$ gas supplied into the processing chamber 12 and the pressure in the first space S1 in each of the open state and the shielded state was obtained.

Figure 15:
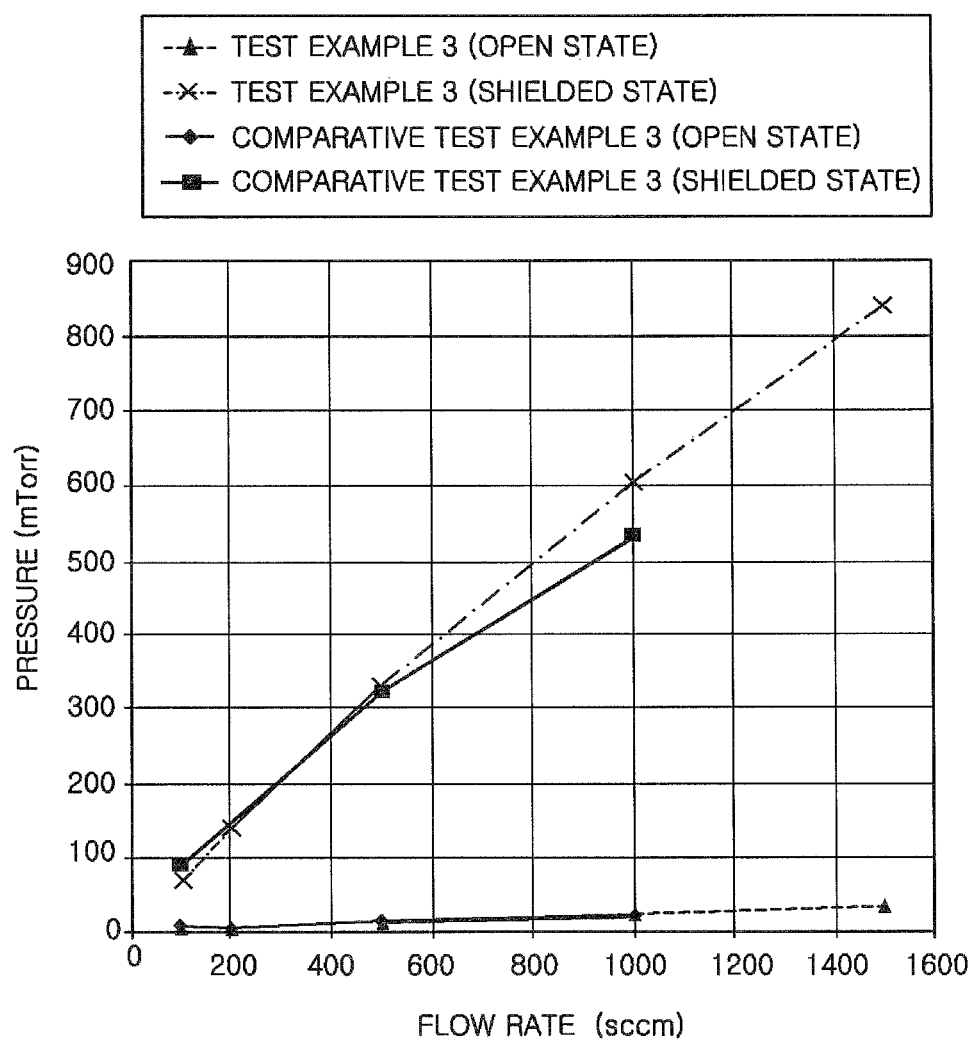
FIG. 15 is a graph showing results of a test example 3 and a comparative example 3.

FIG. 15 shows results of a test example 3 and a comparative example 3. In FIG. 15, the horizontal axis represents a flow rate of $N_2$ gas and the vertical axis represents a pressure in the first space S1. As shown in FIG. 15, the relation between the flow rate of $N_2$ gas and the pressure in the first space S1 in the open state of the test example 3 is substantially the same as that between the flow rate of $N_2$ gas and the pressure in the first space S1 in the open state of the comparative example 3. This shows that the baffle structure 60 used in the test example 3 can provide the same pressure controllability as that of the pressure control valve of the gas exhaust unit 50 in a low pressure region. When the flow rate of $N_2$ gas is smaller than or equal to 500 sccm, the relation between the flow rate of $N_2$ gas and the pressure in the first space S1 in the shielded state of the test example 3 is substantially the same as that between the flow rate of $N_2$ gas and the pressure in the first space S1 in the shielded state of the comparative example 3. When the flow rate of $N_2$ gas is greater than 500 sccm, the baffle structure 60 used in the test example 3 can set the pressure in the first space S1 to a higher level than that set by the pressure control valve of the gas exhaust unit 50 used in the comparative example 3. This shows that the pressure control valve of the gas exhaust unit 50 can provide excellent pressure controllability in a high pressure range in the case of using the baffle structure 60 of the test example 3.

DESCRIPTION OF REFERENCE NUMERALS

10: plasma processing apparatus
12: processing chamber
12s: sidewall
14: mounting table
18: lower table
20: electrostatic chuck
20r: mounting region
30: upper electrode
GS: gas supply unit
50: gas exhaust unit
60: baffle structure
61: first member
61a: first cylindrical part 61h: through-hole
62: second member
62a: second cylindrical part
69: shaft body
70: driving unit
Cnt: control unit
S1: first space
S2: second space

What is claimed is:

1. A plasma processing apparatus for performing plasma processing on a target object, comprising:
   a processing chamber;
   a mounting table provided in the processing chamber, the mounting table having a mounting region on which the target object is mounted;
   a baffle structure provided below the mounting region and between the mounting table and the processing chamber, the baffle structure defining a first space including the mounting region and a second space below the mounting region in the processing chamber, wherein the baffle structure includes:
   a first member having a first cylindrical part extending between the mounting table and the processing chamber and having a plurality of through-holes elongated in a vertical direction, wherein the first cylindrical part extends in a circumferential direction around the mounting table, and the plurality of through-holes are positioned along the first cylindrical part in the circumferential direction, and
   a second member having a second cylindrical part having an inner diameter greater than an outer diameter of the first cylindrical part;
   a gas supply unit connected to the first space;
   a gas exhaust unit connected to the second space; and
   a driving unit configured to vertically move the second cylindrical part in a region including a gap between the first member and the processing chamber,
   wherein the first member includes a lower annular part and an upper annular part,
   wherein the upper annular part of the first member is supported by a sidewall of the processing chamber and the lower annular part of the first member is supported by the mounting table,
   wherein when the second cylindrical part is in a vertical position in which the second cylindrical part fully faces and shields the through-holes of the first cylindrical part, the first space communicates with the second space via the through-holes and a gap in a diametrical direction between the first cylindrical part and the second cylindrical part,
   wherein the second cylindrical part does not have through-holes such that when the second cylindrical part fully faces and shields the through-holes of the first cylindrical part, conductance between the first space and the second space is through the gap between the first cylindrical part and the second cylindrical part, and
   wherein the second member includes an annular part extending from a lower end of the second cylindrical part in a diametrically outward direction at a location below a location at which the upper annular part of the first member is supported by the sidewall of the processing chamber such that, when the second cylindrical part is in a vertical position in which the second cylindrical part does not face the through-holes of the first cylindrical part, the first space communicates with the second space through the through-holes of the first cylindrical part and between the sidewall of the chamber and the annular part extending from the lower end of the second cylindrical part.

2. The plasma processing apparatus of claim 1, further comprising a control unit configured to control the driving unit,
   wherein the control unit performs:
   first control in which the driving unit is controlled to set a vertical position of the second member to a first position, and
   second control in which the driving unit is controlled to set a vertical position of the second member to a second position different from the first position.

3. The plasma processing apparatus of claim 2, wherein the control unit controls the gas supply unit to supply a first gas during the first control and to supply a second gas different from the first gas during the second control.

4. The plasma processing apparatus of claim 1, wherein the sidewall of the processing chamber includes an upper part and a lower part, and
   wherein the plasma processing apparatus further comprises a supporting member having an upper part interposed between the upper part and the lower part of the sidewall and lower part to which the upper annular part of the first member is fixed.

5. The plasma processing apparatus of claim 3, wherein the first gas includes a deposition gas and the second gas includes a corrosion gas.

6. The plasma processing apparatus of claim 1, wherein a length in a diametrical direction of the gap between the first cylindrical part and the second cylindrical part is set for obtaining a predetermined conductance between the first space and the second space when the second cylindrical part is in the vertical position in which the second cylindrical part fully faces the through-holes of the first cylindrical part, and
   wherein the length in the diametrical direction of the gap between the first cylindrical part and the second cylindrical part is set to 0.4 mm.

* * * * *